United States Patent
Fisher et al.

(10) Patent No.: US 9,312,416 B2
(45) Date of Patent: Apr. 12, 2016

(54) METHOD OF FORMING AN ELECTRONIC ARTICLE

(71) Applicant: Dow Corning Corporation, Midland, MI (US)

(72) Inventors: Mark Fisher, Midland, MI (US); Don Juen, Sanford, MI (US); Barry Ketola, Freeland, MI (US); Nick Shephard, Midland, MI (US)

(73) Assignee: DOW CORNING CORPORATION, Midland, MI (US)

( * ) Notice: Subject to any disclaimer, the term of this patent is extended or adjusted under 35 U.S.C. 154(b) by 0 days.

(21) Appl. No.: 14/440,754

(22) PCT Filed: Nov. 12, 2013

(86) PCT No.: PCT/US2013/069689
§ 371 (c)(1),
(2) Date: May 5, 2015

(87) PCT Pub. No.: WO2014/075073
PCT Pub. Date: May 15, 2014

(65) Prior Publication Data
US 2015/0263208 A1   Sep. 17, 2015

Related U.S. Application Data

(60) Provisional application No. 61/725,277, filed on Nov. 12, 2012.

(51) Int. Cl.
| | |
|---|---|
| H01L 31/048 | (2014.01) |
| C08L 83/04 | (2006.01) |
| B32B 37/10 | (2006.01) |
| B32B 37/12 | (2006.01) |
| B32B 37/18 | (2006.01) |
| H01L 31/18 | (2006.01) |
| C08G 77/12 | (2006.01) |
| C08G 77/20 | (2006.01) |

(52) U.S. Cl.
CPC ........ *H01L 31/0481* (2013.01); *B32B 37/1009* (2013.01); *B32B 37/1292* (2013.01); *B32B 37/18* (2013.01); *C08L 83/04* (2013.01); *H01L 31/048* (2013.01); *H01L 31/18* (2013.01); *B32B 2037/1253* (2013.01); *B32B 2307/20* (2013.01); *B32B 2307/40* (2013.01); *B32B 2457/12* (2013.01); *C08G 77/12* (2013.01); *C08G 77/20* (2013.01); *Y02E 10/50* (2013.01)

(58) Field of Classification Search
None
See application file for complete search history.

(56) References Cited

U.S. PATENT DOCUMENTS

| | | |
|---|---|---|
| 6,020,409 A | 2/2000 | Alvarez et al. |
| 6,169,155 B1 | 1/2001 | Alvarez et al. |
| 2011/0061724 A1 | 3/2011 | Houle et al. |
| 2011/0203664 A1 | 8/2011 | Howell et al. |
| 2013/0059109 A1 | 3/2013 | Kretschmann et al. |

FOREIGN PATENT DOCUMENTS

| | | |
|---|---|---|
| WO | 2014008322 A1 | 1/2014 |
| WO | 2014075036 A1 | 5/2014 |
| WO | 2014075058 A1 | 5/2014 |

OTHER PUBLICATIONS

International Search Report PCT/US2013/069689 dated Mar. 6, 2014.
ASTM 1898-1998, A Century of Progress.
Standard Test Methods for Solar Energy Transmittance and Reflectance (Terrestrial) of Sheet Materials; Active Standard ASTM E424 (2007), http://www.astm.org/Standards/E424.htm.
ASTM International, Wikipedia Nov. 12, 2015, https://en.wikipedia.org/wiki/ASTM_International.
ASTM International, Detailed Overview, Nov. 12, 2015, http://www.astm.org/ABOUT/full_overview.html.

*Primary Examiner* — Seahvosh Nikmanesh
(74) *Attorney, Agent, or Firm* — Dow Corning Corporation

(57) ABSTRACT

An electronic article has a perimeter and includes a superstrate, an optoelectronic element disposed on the superstrate, and a silicone encapsulant that is formed from a curable silicone composition and that is disposed on the optoelectronic element sandwiching the optoelectronic element between the superstrate and the silicone encapsulant. The electronic article is formed using a method that includes the step of depositing the curable silicone composition on the optoelectronic element in a pattern defining at least one passage extending from an interior of the electronic article to a perimeter of the electronic article. The method also includes laminating the superstrate, the optoelectronic element, and the curable silicone composition. The curable silicone composition has a complex viscosity of from 10,000 to 50,000,000 cPs at 25° C. as measured at 1 radian per second at 1 to 5% strain. During lamination, the curable silicone composition cures to form the silicone encapsulant and air escapes from through the at least one passage.

17 Claims, No Drawings

METHOD OF FORMING AN ELECTRONIC ARTICLE

CROSS REFERENCE TO RELATED APPLICATIONS

This application is a U.S. national stage filing under 35 U.S.C. §371 of PCT Application No. PCT/US13/069689 filed on Nov. 12, 2013, which claims the benefit of U.S. Provisional Patent Application No. 61/725,277 filed Nov. 12, 2012, under 35 U.S.C. §119 (e). PCT Application No. PCT/US13/069689 and U.S. Provisional Patent Application No. 61/725,277 are hereby incorporated by reference.

Optoelectronic elements, and electronic articles that include such elements, are well known in the art. Common optoelectronic elements include photovoltaic (solar) cells and diodes. Photovoltaic cells convert light of many different wavelengths into electricity. Conversely, diodes, such as light emitting diodes (LEDs), generate light of many different wavelengths from electricity.

LEDs generally include one or more diodes that emit light when activated and typically utilize either flip chips or wire bonded chips that are connected to the diodes to provide power. Many LEDs are encapsulated using similar components and methods as those used to encapsulate photovoltaic cells, thereby increasing production costs and complexities.

There are two general types of photovoltaic cells, wafers and thin films. Wafers are thin sheets of semiconductor material that are typically formed from mechanically sawing the wafer from a single crystal or multicrystal ingot. Alternatively, wafers can be formed from casting. Thin film photovoltaic cells usually include continuous layers of semi-conducting materials deposited on a substrate using sputtering or chemical vapor deposition processing techniques. Typically, the photovoltaic cells are included in photovoltaic cell modules that also include tie layers, substrates, superstrates, and/or additional materials that provide strength and stability.

In many applications, optoelectronic elements are encapsulated to provide additional protection from environmental factors such as wind and rain. To date, however, encapsulants and encapsulation methods known in the art have been expensive and time consuming and, in many cases, ineffective. For example, in many applications, air bubbles are trapped in the encapsulants and weaken the mechanical, electrical, and esthetic properties of the optoelectronic elements and electronic articles. Accordingly, there remains an opportunity to improve.

SUMMARY OF THE DISCLOSURE

This disclosure provides a method of forming an electronic article having a perimeter and including a superstrate, an optoelectronic element disposed on the superstrate, and a silicone encapsulant that is formed from a curable silicone composition and that is disposed on the optoelectronic element sandwiching the optoelectronic element between the superstrate and the silicone encapsulant. The method includes the step of depositing the curable silicone composition on the optoelectronic element in a pattern defining at least one passage extending from an interior of the electronic article to a perimeter of the electronic article. The method also includes the step of laminating the superstrate, the optoelectronic element, and the curable silicone composition to form the electronic article. In the method, the curable silicone composition has a complex viscosity of from 10,000 to 50,000,000 cPs at 25° C. measured at 1 radian per second at 1 to 5% strain. In addition, during the step of laminating, the curable silicone composition cures to form the silicone encapsulant and air escapes from the interior of the electronic article to the perimeter of the electronic article through the at least one passage. Typically, this escape of air allows the electronic article to be formed with minimal or no defects (e.g. air bubbles) in the silicone encapsulant.

DETAILED DESCRIPTION OF THE DISCLOSURE

The present disclosure provides a method of forming an electronic article ("article"). The electronic article may be further defined as a photovoltaic cell module ("module"). In an alternative embodiment, the article is further defined as a solid state light or as solid state lighting. In other embodiments, the article is further defined as a lighting device, e.g. a non-solid state lighting device.

Superstrate:

The article has a perimeter and includes a superstrate which may be alternatively described as a first outermost layer. The superstrate typically has a light transmittance of at least 70 percent as determined using UV/Vis spectrophotometry using ASTM E424-71 (2007). In various embodiments, the superstrate has a light transmittance of at least 75, 80, 85, 90, 91, 92, 93, 94, 95, 96, 97, 98, or 99, percent, wherein the light transmittance is at most 100 percent. In an alternative embodiment, the superstrate has a light transmittance of approximately 100 percent (e.g. from 99.5% to 100.0%). The superstrate may be at least partially coated with silicon and oxygen based materials ($SiO_x$) which may be any one or more silicones described below or may be different. In this case, the coating of the $SiO_x$ material would be at least a partially "outermost" layer of the article and the superstrate would be, at least in some areas, a layer interior to the coating.

The superstrate may be, include, consist essentially of (and not include organic monomers or polymers), or consist of, a silicone, e.g. a polyorganosiloxane. The silicone is not particularly limited and may be any of the silicones described below or may be different. In one embodiment, the superstrate is, includes, consists essentially of (and does not include organic monomers or polymers or silicones), or consists of, silica glass (e.g. an amorphous soda-lime glass or borosilicate glass). In another embodiment, the superstrate is not limited to the aforementioned compounds and may include any compound or composition known in the art so long as the superstrate has a light transmittance of at least 70 percent using ASTM E424-71 (2007).

Typically, the superstrate provides protection to a front surface of the article. Similarly, the superstrate may provide protection to a back surface of the article depending on orientation of the article. The superstrate may be soft and flexible or may be rigid and stiff. Alternatively, the superstrate may include rigid and stiff segments while simultaneously including soft and flexible segments. The superstrate may be load bearing or non load bearing and may be included in any portion of the article. Typically, the superstrate is positioned on a top of the article and in front of a light source, e.g. the sun or a light emitting diode. The superstrate may be used to protect the article from environmental conditions such as rain, show, and heat. In one embodiment, the superstrate has a length and width of 125 mm each. In another embodiment, the superstrate has a length and width of 156 mm each. The superstrate, and the instant disclosure, are not limited to these dimensions.

Depending on the orientation of the article, the superstrate may be alternatively described as a substrate, i.e., a superstrate disposed on a "bottom" of the article. For example, if a silicone encapsulant or backsheet, as described below, has a light transmission of at least 70 percent, the superstrate (or substrate) may have a less transmission of less than 70 percent. In various embodiments, the substrate has a light transmission of less than 70 percent determined using ASTM E424-71 (2007) and may have a light transmission of 0, 5, 10, 15, 20, 25, 30, 35, 40, 45, 50, 55, 60, or 65 percent determined using ASTM E424-71 (2007). In various non-limiting embodiments, the terminology superstrate and substrate are used interchangeably. Any of the aforementioned light transmission values may, for example, vary by 1, 2, 3, 4, 5, 10, 15, 20, or 25+% in varying non-limiting embodiments. All values, and ranges of values, between and including the aforementioned values are also hereby expressly contemplated in various non-limiting embodiments.

Optoelectronic Element:

The article also includes an optoelectronic element disposed on the superstrate. The optoelectronic element may be disposed on and in direct contact with the superstrate or may be disposed apart from the superstrate but may still be disposed thereon. In one embodiment, the optoelectronic element is disposed on and in direct contact with the superstrate via chemical vapor deposition or sputtering. In an alternative embodiment, the optoelectronic element is disposed on the superstrate and spaced apart from the superstrate. In this embodiment, the optoelectronic element may be disposed on and in direct contact with a silicone tie layer, as described in greater detail below, which itself is disposed on and in direct contact with the superstrate. Said differently, in this embodiment, the silicone tie layer may be sandwiched between the optoelectronic element and the superstrate.

The optoelectronic element is typically a device that sources and/or detects and controls light such as visible light, gamma rays, x-rays, ultraviolet rays, and infrared rays. Optoelectronic elements typically operate as electrical-to-optical or optical-to-electrical transducers. Typical, but non-limiting optoelectronic elements include photodiodes including solar cells, phototransistors, photomultipliers, integrated optical circuit (IOC) elements, photoresistors, photoconductive camera tubes, charge-coupled imaging devices, injection laser diodes, quantum cascade lasers, light-emitting diodes, photoemissive camera tubes, and the like. In one embodiment, the optoelectronic element is further defined as a solar (or photovoltaic) cell. In another embodiment, the optoelectronic element is further defined as a light emitting diode.

The optoelectronic element may be further defined as an optoelectronic semiconductor. Typically, the optoelectronic element has an electrical conductivity of from about $10^3$ S/cm to about $10^{-8}$ S/cm. In one embodiment, the optoelectronic element includes silicon. In other embodiments, the optoelectronic element includes arsenic, selenium, tellurium, germanium, gallium arsenide, silicon carbide, and/or elements from Groups IV, III-V, II-VI, I-VII, IV-VI, V-VI, and II-V, and may be of p- or n-type.

The optoelectronic element has a first side and a second side. Typically the first side is opposite the second side. However, the first and second sides may be adjacent each other. In various embodiments, one or more of electrical leads are attached to one or both of the first and second sides to connect a series of optoelectronic elements together. The electrical leads may be of any size and shape and typically are rectangular-shaped. In one embodiment, the electrical leads have dimensions of approximately 0.005 to 0.080 inches in length and/or width. In other embodiments, the electrical leads have a thickness of from 0.005 to 0.015, from 0.005 to 0.010, or from 0.007 to 0.010, inches. The electrical leads may be of any type known in the art and may be disposed on any portion of the optoelectronic element.

Typically, one electrical lead acts as an anode while another electrical lead acts as a cathode. In various embodiments, the optoelectronic element includes one or more electrical leads disposed thereon, e.g. first, second, third, and fourth electrical leads. These electrical leads may be the same or may be different from each other (i.e., made from the same material or from different materials) and may include metals, conducting polymers, and combinations thereof. In one embodiment, the one or more electrical leads include tin-silver solder coated copper. In another embodiment, the one or more electrical leads include tin-lead solder coated copper. The optoelectronic element itself is not limited in size or shape and may be any size or shape known in the art.

Silicone Encapsulant:

The article also includes a silicone encapsulant. The silicone encapsulant is formed from a curable silicone composition that is disposed on the optoelectronic element. The silicone encapsulant sandwiches the optoelectronic element between the superstrate and the silicone encapsulant. The silicone encapsulant may be, include, consist essentially of, or consist of, the cured (reaction) product of the curable silicone composition, i.e., a cured silicone composition or a cured polyorganosiloxane. Alternatively, the silicone encapsulant may be, include, consist essentially of, or consist of, a silicone, i.e. a polyorganosiloxane or a cured polyorganosiloxane. The terminology "consisting essentially of" describes that the silicone composition and/or the cured reaction product and/or the cured silicone composition and/or the cured polyorganosiloxane is free of organic or non-silicone polymers.

The curable silicone composition is not particularly limited except that is typically has a complex (dynamic) viscosity of from 10,000 to 5,000,000 cPs at 25° C. measured at 1 radian per second at 1 to 5% strain. More specifically, a Frequency Sweep is generated on a TA Instruments, HR-2 parallel plate Rheometer. A sample is loaded between two 25 mm parallel plates to a 2 mm thickness. The frequency sweep is run from 0.1 rad/sec to 100 rad/sec at a 5% strain, the dynamic (complex) viscosity is reported at 1 rad/sec in cP. In other embodiments, the complex viscosity is from 15,000 to 100,000, from 20,000 to 95,000, from 25,000 to 90,000, from 30,000 to 85,000, from 35,000 to 75,000, from 40,000 to 70,000, from 45,000 to 65,000, from 50,000 to 60,000, or from 55,000 to 60,000, cPs at 25° C. measured as described above. In other embodiments, the complex viscosity is from 50,000 to 100,000, from 55,000 to 95,000, from 60,000 to 90,000, from 65,000 to 85,000, from 70,000 to 80,000, or from 75,000 to 80,000, cPs at 25° C. measured as described above.

In still other embodiments, the complex viscosity is from 35,000 to 300,000, from 40,000 to 295,000, from 45,000 to 290,000, from 50,000 to 285,000, from 55,000 to 280,000, from 60,000 to 275,000, from 65,000 to 275,000, from 70,000 to 270,000, from 75,000 to 265,000, from 80,000 to 260,000, from 85,000 to 255,000, from 90,000 to 250,000, from 95,000 to 245,000, from 100,000 to 240,000, from 105,000 to 235,000, from 110,000 to 230,000, from 115,000 to 225,000, from 120,000 to 220,000, from 125,000 to 215,000, from 130,000 to 210,000, from 135,000 to 205,000, from 140,000 to 200,000, from 145,000 to 195,000, from 150,000 to 190,000, from 155,000 to 185,000, from 160,000 to 180,000, from 165,000 to 175,000, or from 165,000 to 170,000, from 80,000 to 200,000, from 40,000 to 200,000, or from 40,000 to 300,000, cPs at 25° C. measured as described above.

In still other embodiments, the complex viscosity is from 100,000 to 1,000,000, from 125,000 to 975,000, from 150,000 to 950,000, from 175,000 to 925,000, from 200,000 to 900,000, from 225,000 to 875,000, from 250,000 to 850,000, from 275,000 to 825,000, from 300,000 to 800,000, from 325,000 to 775,000, from 350,000 to 750,000, from 375,000 to 725,000, from 400,000 to 700,000, from 425,000 to 675,000, from 450,000 to 650,000, from 475,000 to 625,000, from 500,000 to 600,000, from 525,000 to 575,000, or from 550,000 to 575,000, cPs at 25° C. measured as described above. In even further embodiments, the complex viscosity is from 1,125,000 to 1,975,000, from 1,150,000 to 1,950,000, from 1,175,000 to 1,925,000, from 1,200,000 to 1,900,000, from 1,225,000 to 1,875,000, from 1,250,000 to 1,850,000, from 1,275,000 to 1,825,000, from 1,300,000 to 1,800,000, from 1,325,000 to 1,775,000, from 1,350,000 to 1,750,000, from 1,375,000 to 1,725,000, from 1,400,000 to 1,700,000, from 1,425,000 to 1,675,000, from 1,450,000 to 1,650,000, from 1,475,000 to 1,625,000, from 1,500,000 to 1,600,000, from 1,525,000 to 1,575,000, from 1,550,000 to 1,575,000, from 2,125,000 to 2,975,000, from 2,150,000 to 2,950,000, from 2,175,000 to 2,925,000, from 2,200,000 to 2,900,000, from 2,225,000 to 2,875,000, from 2,250,000 to 2,850,000, from 2,275,000 to 2,825,000, from 2,300,000 to 2,800,000, from 2,325,000 to 2,775,000, from 2,350,000 to 2,750,000, from 2,375,000 to 2,725,000, from 2,400,000 to 2,700,000, from 2,425,000 to 2,675,000, from 2,450,000 to 2,650,000, from 2,475,000 to 2,625,000, from 2,500,000 to 2,600,000, from 2,525,000 to 2,575,000, from 2,550,000 to 2,575,000, from 3,125,000 to 3,975,000, from 3,150,000 to 3,950,000, from 3,175,000 to 3,925,000, from 3,200,000 to 3,900,000, from 3,225,000 to 3,875,000, from 3,250,000 to 3,850,000, from 3,275,000 to 3,825,000, from 3,300,000 to 3,800,000, from 3,325,000 to 3,775,000, from 3,350,000 to 3,750,000, from 3,375,000 to 3,725,000, from 3,400,000 to 3,700,000, from 3,425,000 to 3,675,000, from 3,450,000 to 3,650,000, from 3,475,000 to 3,625,000, from 3,500,000 to 3,600,000, from 3,525,000 to 3,575,000, from 3,550,000 to 3,575,000, from 4,125,000 to 4,975,000, from 4,150,000 to 4,950,000, from 4,175,000 to 4,925,000, from 4,200,000 to 4,900,000, from 4,225,000 to 4,875,000, from 4,250,000 to 4,850,000, from 4,275,000 to 4,825,000, from 4,300,000 to 4,800,000, from 4,325,000 to 4,775,000, from 4,350,000 to 4,750,000, from 4,375,000 to 4,725,000, from 4,400,000 to 4,700,000, from 4,425,000 to 4,675,000, from 4,450,000 to 4,650,000, from 4,475,000 to 4,625,000, from 4,500,000 to 4,600,000, from 4,525,000 to 4,575,000, or from 4,550,000 to 4,575,000, cPs at 25° C. measured as described above. Any one or more of the aforementioned values can be increased by an order of magnitude. As just one example, the curable silicone composition may have a complex viscosity of from 10,000 to 50,000,000 cPs at 25° C. measured as described above. Any of the aforementioned values may, for example, vary by 1, 2, 3, 4, 5, 10, 15, 20, or 25+% in varying non-limiting embodiments. All values, and ranges of values, between and including the aforementioned values are also hereby expressly contemplated in various non-limiting embodiments. The aforementioned viscosity is the complex viscosity of the curable silicone composition before curing. After curing, the cured reaction product is typically a solid but may also be a gel.

The curable silicone composition can be further defined as being, including, consisting essentially of, or consisting of, a hydrosilylation-curable silicone composition, a condensation-curable silicone composition, and/or free-radical curable silicone composition such as a radiation-curable silicone composition and a light (e.g. UV light) curable composition, and a peroxide-curable silicone composition. The terminology "consisting essentially of" describes an embodiment wherein the curable silicone composition is curable by one type of curing mechanism and is free of one or more compositions that are curable by a different curing mechanism.

A hydrosilylation-curable silicone composition typically includes a polyorganosiloxane having an average of at least two silicon-bonded alkenyl groups or silicon-bonded hydrogen atoms per molecule; an organosilicon compound in an amount sufficient to cure the polyorganosiloxane, wherein the organosilicon compound has an average of at least two silicon-bonded hydrogen atoms or silicon-bonded alkenyl groups per molecule capable of reacting with the silicon-bonded alkenyl groups or silicon-bonded hydrogen atoms in the polyorganosiloxane; and a catalytic amount of a hydrosilylation catalyst.

A condensation-curable silicone composition typically includes a polyorganosiloxane having an average of at least two silicon-bonded hydrogen atoms, hydroxy groups, or hydrolysable groups per molecule and, optionally, a crosslinking agent having silicon-bonded hydrolysable groups and/or a condensation catalyst.

A radiation-curable silicone composition typically includes a polyorganosiloxane having an average of at least two silicon-bonded radiation-sensitive groups per molecule and, optionally, a cationic or free-radical photoinitiator depending on the nature of the radiation-sensitive groups in the polyorganosiloxane.

A peroxide-curable silicone composition typically includes a polyorganosiloxane having silicon-bonded unsaturated aliphatic hydrocarbon groups and an organic peroxide.

The silicone composition can be cured by exposing the composition to ambient temperature, elevated temperature, moisture, or radiation, depending on the type of curable silicone composition.

Hydrosilylation-curable silicone compositions can be cured by exposing the composition to a temperature of from room temperature (about 23±2° C.) to 250° C., alternatively from room temperature to 150° C., alternatively from room temperature to 115° C., at atmospheric pressure. The silicone composition is generally heated for a length of time sufficient to cure (cross-link) the polyorganosiloxane. For example, the film is typically heated at a temperature of from 100 to 150° C. for a time of from 0.1 to 3 hours.

Condensation-curable silicone compositions cure depending on the nature of the silicon-bonded groups in the polyorganosiloxane. For example, when the polyorganosiloxane includes silicon-bonded hydroxy groups, the composition can be cured (i.e., cross-linked) by heating the composition. The composition can typically be cured by heating it at a temperature of from 50 to 250° C., for a period of from 1 to 50 hours. When the condensation-curable silicone composition includes a condensation catalyst, the composition can typically be cured at a lower temperature, e.g., from room temperature (about 23±2° C.) to 150° C.

Condensation-curable silicone composition typically include a polyorganosiloxane having silicon-bonded hydrogen atoms and can be cured by exposing the composition to moisture or oxygen at a temperature of from 100 to 450° C. for a period of from 0.1 to 20 hours. When the condensation-curable silicone composition includes a condensation catalyst, the composition can typically be cured at a lower temperature, e.g., from room temperature (about 23±2° C.) to 400° C.

Further, when the curable silicone composition is a condensation-curable silicone composition including a polyorganosiloxane having silicon-bonded hydrolysable groups, the composition can be cured by exposing the composition to moisture at a temperature of from room temperature (about 23±2° C.) to 250° C., alternatively from 100 to 200° C., for a period of from 1 to 100 hours. For example, the silicone composition can typically be cured by exposing it to a relative humidity of 30% at a temperature of from about room temperature (about 23±2° C.) to 150° C., for a period of from 0.5 to 72 hours. Cure can be accelerated by application of heat, exposure to high humidity, and/or addition of a condensation catalyst to the composition.

Radiation-curable silicone compositions can be cured by exposing the composition to an electron beam. Typically, the accelerating voltage is from about 0.1 to 100 kiloelectron volt (keV), the vacuum is from about 10 to $10^{-3}$ Pascals (Pa), the electron current is from about 0.0001 to 1 ampere, and the power varies from about 0.1 watt to 1 kilowatt. The dose is typically from about 100 microcoulombs per centimeter squared (microcoulomb/cm$^2$) to 100 coulomb per centimeter squared (coulomb/cm$^2$), alternatively from about 1 to 10 coulombs/cm$^2$. Depending on the voltage, the time of exposure is typically from about 10 seconds to 1 hour.

Also, when the radiation-curable silicone composition further includes a cationic or free radical photoinitiator, the composition can be cured by exposing it to radiation having a wavelength of from 150 to 800 nanometers (nm), alternatively from 200 to 400 nm, at a dosage sufficient to cure (cross-link) the polyorganosiloxane. The light source is typically a medium pressure mercury-arc lamp. The dose of radiation is typically from 30 to 1,000 millijoules per centimeter squared (mJ/cm$^2$), alternatively from 50 to 500 mJ/cm$^2$. Moreover, the silicone composition can be externally heated during or after exposure to radiation to enhance the rate and/or extent of cure.

When the curable silicone composition is a peroxide-curable silicone composition, the composition can be cured by exposing it to a temperature of from room temperature (about 23±2° C.) to 180° C., for a period of from 0.05 to 1 hours.

The curable silicone composition and/or the silicone encapsulant may have a light transmittance of at least 70 percent as determined using UV/Vis spectrophotometry using ASTM E424-71 (2007). In various embodiments, the curable silicone composition and/or the silicone encapsulant has a light transmittance of at least 75, 80, 85, 90, 91, 92, 93, 94, 95, 96, 97, 98, or 99, percent, wherein the light transmittance is at most 100 percent. In an alternative embodiment, the curable silicone composition and/or the silicone encapsulant has a light transmittance of approximately 100 percent (e.g. from 99.5% to 100.0%). The curable silicone composition and/or the silicone encapsulant may have a thickness of 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, or 1, 2, 3, 4, 5, 6, 7, 8, 9, 10, 11, 12, 13, 14, 15, 16, 17, 18, 19, 20, 25, 30, 35, 40, 45, 50, 55, 60, 65, 70, 75, 80, 85, 90, 95, or 100, or more, mils Any of the aforementioned values may, for example, vary by 1, 2, 3, 4, 5, 10, 15, 20, or 25+% in varying non-limiting embodiments. All values, and ranges of values, between and including the aforementioned values are also hereby expressly contemplated in various non-limiting embodiments.

Silicone Tie Layer:

The article may also include a silicone tie layer disposed on the superstrate and sandwiched between the optoelectronic element and the superstrate. Typically, the silicone tie layer is formed from a second silicone composition which may be the same or different from the curable silicone composition described above.

For example, the silicone tie layer may be, include, consist essentially of, or consist of, the cured (reaction) product of the second silicone composition, i.e., a cured second silicone composition or a cured second polyorganosiloxane. Alternatively, the silicone tie layer may be, include, consist essentially of, or consist of, an uncured second silicone composition, i.e., an uncured second polyorganosiloxane. The second silicone composition can be further defined as being, including, consisting essentially of, or consisting of, a second hydrosilylation-curable silicone composition, a second condensation-curable silicone composition, and/or a second free-radical curable silicone composition such as a radiation-curable silicone composition and a light (e.g. UV light) curable composition, and a second peroxide-curable silicone composition, each of which may independently be the same or different than any described above. Similarly, in one embodiment, the terminology "consisting essentially of" is the same as described above. The second curable silicone composition may be cured or uncured both at application and in a final article or may be cured during a process of forming the article.

The silicone tie layer and/or the second curable silicone composition may have a light transmittance of at least 70 percent as determined using UV/Vis spectrophotometry using ASTM E424-71 (2007). In various embodiments, the silicone tie layer and/or the second curable silicone composition has a light transmittance of at least 75, 80, 85, 90, 91, 92, 93, 94, 95, 96, 97, 98, or 99, percent, wherein the light transmittance is at most 100 percent. In an alternative embodiment, the silicone tie layer and/or the second curable silicone composition has a light transmittance of approximately 100 percent (e.g. from 99.5% to 100.0%). Any of the aforementioned values may, for example, vary by 1, 2, 3, 4, 5, 10, 15, 20, or 25+% in varying non-limiting embodiments. All values, and ranges of values, between and including the aforementioned values are also hereby expressly contemplated in various non-limiting embodiments.

The silicone tie layer may be formed from a curable composition including silicon atoms, such as those disclosed in U.S. Pat. Nos. 6,020,409 and 6,169,155, herein expressly incorporated by reference relative to these curable silicone compositions. In an alternative embodiment, the silicone tie layer may be formed from a cured or curable composition that includes a silicone fluid such as those commercially available from Dow Corning Corporation of Midland, Mich. One non-limiting example of a particularly suitable silicone fluid is trimethylsilyl terminated polydimethylsiloxane having a complex viscosity of 100 mPa·s at 25° C.

In one embodiment, one or more of the first and second curable silicone compositions, i.e., those used to form the silicone encapsulant and/or the silicone tie layer, is further defined as hydrosilylation-curable and includes an organosilicon compound having at least one unsaturated moiety per molecule, an organohydrogensilicon compound having at least one silicon-bonded hydrogen atom per molecule, and a hydrosilylation catalyst used to accelerate a hydrosilylation reaction between the organosilicon compound and the organohydrogensilicon compound. In this embodiment, a ratio of silicon-bonded hydrogen atoms per molecule of the organohydrogensilicon compound to unsaturated moieties per molecule of the organosilicon compound is typically of from 0.05 to 100.

In an alternative embodiment, the organosilicon compound is further defined as an alkenyldialkylsilyl end-blocked polydialkylsiloxane which may itself be further defined as vinyldimethylsilyl end-blocked polydimethylsiloxane. The organohydrogensilicon compound may also be further defined as a mixture of a dialkylhydrogensilyl terminated polydialkylsiloxane and a trialkylsilyl terminated polydialkylsiloxane—alkylhydrogensiloxane co-polymer. The dialkylhydrogensilyl terminated polydialkylsiloxane itself may be further defined as dimethylhydrogensilyl terminated polydimethylsiloxane while the trialkylsilyl terminated polydialkylsiloxane—alkylhydrogensiloxane co-polymer may be further defined as a trimethylsilyl terminated polydimethylsiloxane—methylhydrogensiloxane co-polymer. Alternatively, the silicone tie layer and/or the silicone encapsulant may be formed from a curable composition including one or more of components (A)-(E) and combinations thereof, as described in U.S. App. Pub. No. 2011/0061724, expressly incorporated herein by reference relative to these components.

The second curable silicone composition and/or the silicone tie layer may have a thickness of 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, or 1, 2, 3, 4, 5, 6, 7, 8, 9, 10, 11, 12, 13, 14, 15, 16, 17, 18, 19, 20, 25, 30, 35, 40, 45, 50, 55, 60, 65, 70, 75, 80, 85, 90, 95, or 100, or more, mils Any of the aforementioned values may, for example, vary by 1, 2, 3, 4, 5, 10, 15, 20, or 25+% in varying non-limiting embodiments. All values, and ranges of values, between and including the aforementioned values are also hereby expressly contemplated in various non-limiting embodiments.

Non-Silicone Tie Layer:

It is also contemplated that a non-silicone tie layer may be utilized in addition to the silicone tie layer described above or in place of the silicone tie layer. The non-silicone tie layer may have one or more properties or description as set forth above and may be disposed as described above, relative to the silicone tie layer or may be different. The non-silicone tie layer is typically free of silicone and may be, include, consist essentially of, or consist of, an organic polymer, plastic, wood, metal, or silica glass.

Backsheet:

The article may also include a backsheet. The backsheet may be disposed on the silicone encapsulant and sandwich the silicone encapsulant between the optoelectronic element and the backsheet. The backsheet may be disposed on the optoelectronic element. Alternatively, the optoelectronic element may be disposed on the backsheet. The backsheet may bind the superstrate and the optoelectronic element and/or at least partially encapsulate the optoelectronic element. In various embodiments, the backsheet is further described as a controlled bead. The controlled bead is typically applied in a rectangular shape. However, the controlled bead may be formed in any shape. The controlled bead may be in contact with an interior portion of the superstrate, the optoelectronic element, or both the superstrate and the optoelectronic element thereby leaving a space along the perimeter of the superstrate, the optoelectronic element, or both the superstrate and the optoelectronic element that does not include the backsheet. In one embodiment, this space is approximately ½ inch in width. The backsheet and/or composition used to form the backsheet may be described as a matrix in which a plurality of fibers, as described below, are disposed in and/or encapsulated by a silicone. In such an embodiment, the backsheet and/or composition used to form the backsheet may be, include, consist essentially of, or consist of silicone and still include the plurality of fibers. This silicone may be the same or different as any other silicone described herein.

The backsheet typically has a thickness of from 1 to 50, more typically of from 4 to 40, even more typically of from 3 to 30, and still more typically of from 4 to 15, and most typically of from 4 to 10, mils. The conversion for mils to various SI units is 0.0254 mm/mil or 25.4 microns/mil. The backsheet may be tacky or non-tacky and may be a gel, gum, liquid, paste, resin, or solid. The backsheet may be formed from a liquid silicone composition, which may be the same or different than any silicone described herein, and may be cured or partially cured to be tacky or non-tacky and/or a gel, gum, liquid, paste, resin, or solid. In one embodiment, partial curing occurs when less than 90 percent of appropriate (i.e., expected) reactive moieties react. In another embodiment, curing occurs when at least 90 percent of appropriate (i.e., expected) reactive moieties react, as determined by $^{29}$Si NMR. The backsheet may free of one or more of organic polymers, polymers other than silicones, polyethylene terephthalate, polyethylene naphthalate, polyvinyl fluoride, and/or ethylene vinyl acetate. The backsheet may be free of Tedlar®.

Plurality of Fibers:

The article, the silicone encapsulant, and/or the backsheet may include a single fiber or a plurality of fibers. In another embodiment, one or more of the article, the silicone encapsulant, and/or the backsheet is free of the plurality of fibers and also of single fibers. The plurality of fibers may be present in the silicone encapsulant and/or the backsheet, e.g. at least partially encapsulated by the silicone encapsulant and/or the backsheet, independent from the silicone encapsulant and/or the backsheet, or both. The silicone encapsulant and/or the backsheet may include at least two or a plurality of individual fibers. Alternatively, the plurality of fibers may be present as an independent and discrete layer in the article. The plurality of fibers may be disposed in the article and/or the silicone encapsulant and/or the backsheet. For example, the terminology "disposed" may describe that the plurality of fibers is widely distributed as opposed to being concentrated in a small area.

The terminology "fiber" includes continuous filaments and/or discrete lengths of materials that may be natural or synthetic. Natural fibers include, but are not limited to, those produced by plants, animals, and geological processes such as vegetable, wood, animal, and natural mineral fibers. Synthetic fibers include, but are not limited to, non-natural mineral fibers such as fiberglass, metallic fibers, carbon fibers, polymer fibers such as polyamide fibers, PET or PBT polyester fibers, phenol-formaldehyde (PF) fibers, polyvinyl alcohol fiber (PVOH) fibers, polyvinyl chloride fiber (PVC) fibers, polyolefins fibers, acrylic fibers, polyacrylonitrile fibers, aromatic polyamide (aramid) fibers, elastomeric fibers, polyurethane fibers, microfibers, and combinations thereof.

In one embodiment, the plurality of fibers has a high modulus and high tensile strength. In another embodiment, the plurality of fibers has a Young's modulus at 25 degrees Celsius (° C.) of at least 3 gigapascals (GPa). For example, the plurality of fibers may have a Young's modulus at 25° C. of from 3 to 1,000 GPa, alternatively from 3 to 200 GPa, alternatively from 10 to 100 GPa. Moreover, the plurality of fibers may have a tensile strength at 25° C. of at least 50 MPa. For example, the plurality of fibers may have a tensile strength at 25° C. of from 50 to 10,000 megapascals (MPa), alternatively from 50 to 1,000 MPa, alternatively from 50 to 500 MPa.

The individual fibers are typically cylindrical in shape and may have a diameter of from 1 to 100 μm, alternatively from 1 to 20 (micrometers) μm, and alternatively form 1 to 10 μm. The plurality of fibers may be heat-treated prior to use to remove organic contaminants. For example, the plurality of fibers may be heated in air at an elevated temperature, for example, 575° C., for a suitable period of time, for example 2 hours.

In one embodiment, the plurality of fibers is further described as a mat or roving. In another embodiment, the plurality of fibers is further described as a textile. The textile may be woven or non-woven or may include both woven and non-woven segments. In one embodiment, the textile is woven and is chosen from the group of fiberglass, polyester, polyethylene, polypropylene, nylon, and combinations thereof. In another embodiment, the textile is non-woven and is chosen from the group of fiberglass, polyester, polyethylene, polypropylene, nylon, and combinations thereof. In a further embodiment, the textile is non-woven fiberglass and is commercially available from Crane Nonwovens of Dalton, Mass. Alternatively, the textile may be non-woven polyester commercially available from Crane Nonwovens. Further, the textile may be non-woven and include polypropylene or polyethylene terephthalate. The textile is not limited to aforementioned types of woven and non-woven textiles and may include any woven or non-woven textile known in the art. In one embodiment, more than one textile, e.g. two, three, or more individual textiles are utilized.

As is known in the art, woven textiles are typically cloths that are formed by weaving and that stretch in bias directions. As is also known in the art, non-woven textiles are neither woven nor knit and are typically manufactured by putting individual fibers together in the form of a sheet or web, and then binding them either mechanically, with an adhesive, or thermally by melting a binder onto the textile. Non-woven textiles may include staple non-woven textiles and spunlaid non-woven textiles. Staple non-woven textiles are typically made by spinning fibers that are spread in a uniform web and then bonded by using either resin or heat. Spunlaid non-woven textiles are typically made in one continuous process by spinning fibers directly disposed into a web. The spunlaid process can be combined with a meltblowing process to form a SMS (spun-melt-spun) non-woven textile.

Non-woven textiles may also include films and fibrillates and can be formed using serration or vacuum-forming to form patterned holes. Fiberglass non-woven textiles typically are one of two types including wet laid mats having wet-chopped, denier fibers having 6 to 20 micrometer diameters or flame attenuated mats having discontinuous denier fibers having 0.1 to 6 micrometer diameters.

The plurality of fibers may be at least partially encapsulated by the silicone encapsulant and/or the backsheet. In various embodiments, at least 50, 75, or 95 percent of a total surface area of the plurality of fibers is encapsulated by the silicone encapsulant and/or the backsheet, wherein the total surface area is at most 100 percent. In another embodiment, approximately 100 percent (e.g. from 99.5 to 100.0 percent) of a total surface area of the plurality of fibers is encapsulated by the silicone encapsulant and/or the backsheet.

The terminology "encapsulated" refers to covering at least part of the surface area of the plurality of fibers. Typically, the backsheet, and/or a composition used to form the backsheet and/or the silicone encapsulant, covers and/or exudes through portions of the plurality of fibers (e.g. the textile) such as pores. In an alternative embodiment, the plurality of fibers is further described as being impregnated with the backsheet and/or a composition used to form the backsheet and/or the silicone encapsulant. The backsheet and/or a composition used to form the backsheet and/or the silicone encapsulant may impregnate some or all of the plurality of fibers. That is, in this embodiment, the backsheet and/or a composition used to form the backsheet and/or the silicone encapsulant coats an exterior (surface area) of the plurality of fibers and is also disposed throughout some or all of the voids described by the plurality of fibers. In other words, in this embodiment, the backsheet and/or a composition used to form the backsheet and/or the silicone encapsulant may exude through some voids and not through others. In a further embodiment, the plurality of fibers is saturated with the composition used to form the backsheet and/or the silicone encapsulant. In another embodiment, the plurality of fibers is not saturated with the composition used to form the backsheet and/or the silicone encapsulant. It is also contemplated that the backsheet and/or a composition used to form the backsheet and/or the silicone encapsulant may encapsulate the plurality of fibers in whole or in part. The surface area of the plurality of fibers may be at least partially encapsulated using any method known in the art including, but not limited to, spraying, dipping, rolling, brushing, and combinations thereof. In one embodiment, the plurality of fibers is placed into the backsheet and/or a composition used to form the backsheet and/or the silicone encapsulant. The backsheet and/or a composition used to form the backsheet and/or the silicone encapsulant may coat at least a part of the total surface area of the plurality of fibers in a thickness 1 to 50, more typically of from 3 to 30, and most typically of from 4 to 15, mils Of course, the disclosure is not limited to these thicknesses.

Photovoltaic Cell Module:

In one embodiment, the electronic article is further defined as a photovoltaic cell module (module). In this embodiment, the optoelectronic element is further defined as a photovoltaic cell. The photovoltaic cell may be disposed on the superstrate or the superstrate may be disposed on the photovoltaic cell. In one embodiment, the photovoltaic cell is disposed directly on the superstrate, i.e., in direct contact with the superstrate. In another embodiment, the photovoltaic cell is spaced apart from the superstrate yet still disposed "on" the superstrate. The photovoltaic cell may be disposed on, and in direct contact with (i.e., directly applied to), the superstrate via chemical vapor deposition and/or physical sputtering. Typically, in this embodiment, no tie layer is required between the photovoltaic cell and the superstrate. This embodiment is typically referred to as a "thin-film" application. After the photovoltaic cell is disposed on the superstrate using sputtering or chemical vapor deposition processing techniques, one or more electrical leads may be attached to the photovoltaic cell. The silicone encapsulant may then be applied over the electrical leads. Alternatively, the photovoltaic cell may be formed apart from the superstrate and/or the module and later disposed on the superstrate.

The photovoltaic cell typically has a thickness of from 50 to 250, more typically of from 100 to 225, and most typically of from 175 to 225, micrometers. In one embodiment, the photovoltaic cell has a length and width of 125 mm each. In another embodiment, the photovoltaic cell has a length and width of 156 mm each. The photovoltaic cell is not limited to these dimensions.

The photovoltaic cell may include large-area, single-crystal, single layer p-n junction diodes. These photovoltaic cells are typically made using a diffusion process with silicon wafers. Alternatively, the photovoltaic cell may include thin epitaxial deposits of (silicon) semiconductors on lattice-matched wafers. In this embodiment, the photovoltaic cell may be classified as for use in either space or terrestrial applications and typically has AM0 efficiencies of from 7 to 40%. Further, the photovoltaic cell may include quantum well devices such as quantum dots, quantum ropes, and the like, and also include carbon nanotubes. Still further, the photovoltaic cell may include mixtures of polymers and nano particles that form a single multi-spectrum layer which can be stacked to make multi-spectrum solar cells more efficient and less expensive.

The composition of the photovoltaic cell is not particularly limited and may include amorphous silicon, monocrystalline silicon, polycrystalline silicon, microcrystalline silicon, nanocrystalline silica, cadmium telluride, copper indium/gallium selenide/sulfide, gallium arsenide, polyphenylene vinylene, copper phthalocyanine, carbon fullerenes, and combinations thereof in ingots, ribbons, thin films, and/or wafers. The photovoltaic cell may also include light absorbing dyes such as ruthenium organometallic dyes. Most typically, the photovoltaic cell includes monocrystalline and polycrystalline silicon.

The photovoltaic cell has a first side and a second side. Typically the first side is opposite the second side. A first electrical lead is typically disposed on the first side while a second electrical lead is typically disposed on the second side. The photovoltaic cell may be alternatively described as a front-contact cell or a rear-contact cell. One of the first and second electrical leads typically acts as an anode while the other typically acts as a cathode. The first and second electrical leads may be the same or may be different and may include metals, conducting polymers, and combinations thereof. In one embodiment, the first and second electrical leads include tin-silver solder coated copper. In another embodiment, the first and second electrical leads include tin-lead solder coated copper.

The first and second electrical leads may be disposed on any part of the first and second sides of the photovoltaic cell. The first and second electrical leads may be of any size and shape and typically are rectangular-shaped and have dimensions of approximately 0.005 to 0.080 inches in length and/or width. The first and second electrical leads typically connect the module (26) to additional modules in a photovoltaic array. The modules may be connected in series or in parallel.

The module can be used in any industry including, but not limited to, automobiles, trucks, marine craft, trains, small electronics, remote area power systems, satellites, space probes, radiotelephones, water pumps, grid-tied electrical systems, batteries, battery chargers, photoelectrochemical applications, polymer solar cell applications, nanocrystal solar cell applications, and dye-sensitized solar cell applications. In one embodiment, a series of modules are electrically connected and form a photovoltaic array. The instant disclosure also provides the photovoltaic array itself. The photovoltaic array includes at least two modules. Photovoltaic arrays are typically used on rooftops, in rural areas connected to battery backups, and in DC pumps, signal buoys, and the like. The photovoltaic array of the instant disclosure may be planar or non-planar and typically functions as a single electricity producing unit wherein the modules are interconnected in such a way as to generate voltage. Typically the modules are electrically connected, as described above, to provide suitable voltage. The photovoltaic array may be of any size and shape and may be utilized in any industry.

Solid State Lighting:

The electronic article can alternatively be further defined as a solid state light, or as solid state lighting, such as light emitting diodes (LEDs). As is known in the art, LEDs typically generate light in a forward biased state when electrons recombine with holes formed in optoelectronic semiconductors. When the electrons recombine, they release photons in a process typically described as electroluminescence. The solid state lighting can be used in any application including, but not limited to, instrument panels & switches, courtesy lighting, turn and stop signals, household appliances, VCR/DVD/stereo/audio/video devices, toys/games instrumentation, security equipment, switches, architectural lighting, signage (channel letters), machine vision, retail displays, emergency lighting, neon and bulb replacement, flashlights, accent lighting full color video, monochrome message boards, in traffic, rail, and aviation applications, in mobile phones, PDAs, digital cameras, lap tops, in medical instrumentation, bar code readers, color & money sensors, encoders, optical switches, fiber optic communication, and combinations thereof.

The article may be, include, consist essentially of, or consist of, one or more silicones and be free of organic compounds, relative to the multiple layers and not describing electrical or optoelectronic elements. More specifically, the superstrate, silicone tie layer, silicone encapsulant, backsheet, and any one or more additional layers may be free of non-silicone compounds or polymers, such as organic compounds or polymers. In one embodiment, the terminology "consist essentially of" describes that the aforementioned layers are free of organic compounds or polymers.

Method of Forming the Electronic Article:

This disclosure also provides a method of forming the electronic article including the superstrate, the optoelectronic element disposed on the superstrate, and the silicone encapsulant that is formed from the curable silicone composition and that is disposed on the optoelectronic element sandwiching the optoelectronic element between the superstrate and the silicone encapsulant. The method includes the step of depositing the curable silicone composition on the optoelectronic element in a pattern defining at least one passage extending from an interior of the electronic article to a perimeter of the electronic article. The step of depositing is not particularly limited. The curable silicone composition may be deposited by any means known in the art including using a brush/trowel, spraying, pouring, dipping, utilizing a dispensing nozzle, roll coating, transfer printing, screen printing, curtain coating, or any method known in the art. It is contemplated that the step of depositing may be alternatively described as dispensing, disposing, applying, or coating. In one embodiment, the method may include first dispensing, e.g. through one or more spray nozzles, followed by manual troweling and optionally a combination of dispensing a mass followed by automated troweling. For example, this may be possible when utilizing long pot life compositions.

The curable silicone composition is deposited in a pattern defining at least one passage extending from an interior of the electronic article to a perimeter of the electronic article. The pattern is not particularly limited and may be further described as a geometric, non-geometric, uniform or non-uniform pattern. A whole or a portion of the pattern may be described as straight, zig-zag, herringbone, circular or oval, triangular, whorl-shaped, ribbon-shaped, marble, spiral-shaped, coil-shaped, curl-shaped, twisted, looped, helix, serpentine, sinusoidal, winding, star shaped, "x" shaped, and/or random. In one embodiment, the curable silicone composition is deposited in one, two, or a plurality of rows. One or more of the rows may be disposed substantially parallel or traverse (i.e., at an angle) with one or more other rows. For example, the passages formed from the curable silicone composition ma extend to opposing or different locations on the perimeter of the electronic article. This may be achieved based on the disposition of the one or more rows of the curable silicone composition.

One or more of the rows or portions of the pattern may have a length, width, and/or height of 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, or 1 inch. Similarly, one or more rows or portions of the pattern may be disposed apart from one or more other rows or portions of the pattern at a distance of 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 1, 2, 3, 4, 5, or 6 inches or more. Any of the aforementioned values may, for example, vary by 1, 2, 3, 4, 5, 10, 15, 20, or 25+% in varying non-limiting embodiments. All values, and ranges of values, between and including the aforementioned values are also hereby expressly contemplated in various non-limiting embodiments.

The passage is also not particularly limited. Typically, the passage is defined on two or more sides by the deposition of the curable silicone composition. The passage may alternatively be described as a conduit, duct, fluting, furrow, gouge, groove, gutter, pass, passage, trough, channel, lane, opening, or pathway.

The passage extends from an interior of the article to the perimeter (e.g. an exterior) of the article and may originate at any point on the interior of the article. The passage may extend across an entirety of the interior or across a portion of the interior. The passage may extend to two or more points on the perimeter of the article or a single point. The passage may be further defined as one, two, or a plurality of individual passages that may be connected or not connected to each other in whole or in one or more parts. The air may pass through the passage to the perimeter of the article before the deposited curable silicone composition defining the passage merges together to fill in and thereby eliminate the passage. Typically the passage is defined such that air can pass through the passage and exit the article to reduce or eliminate the presence of any air bubbles in one or more layers, e.g. the silicone encapsulant. Said differently, the passage typically allows air to flow from an interior of the article (e.g. from a center), out towards a perimeter of the article (e.g. to the edges), thereby minimizing the amount of air trapped in the article in any one or more layers or components. The same, similar, or a different pattern may be utilized when applying the second curable silicone composition. Alternatively, the second curable silicone composition may be applied randomly, i.e., without a pattern and without any channels.

Referring back, the method also includes the step of laminating the superstrate, the optoelectronic element, and the curable silicone composition to form the electronic article. The step of laminating is not particularly limited and may include any one or more laminating techniques known in the art. For example, the step of laminating may be described as contacting and/or compressing any one or more of the above with another. The step of compressing may include applying a mechanical weight, press, or roller (e.g. a pinch roller). The step of compressing may be further defined as applying a force on the interior (e.g. at the center) of the article or any one or more layers of components. This force may be moved towards the perimeter or edges of the article. For example, this force may be applied at the center and then moved outwards to assist in the evacuation of air from the article.

The step of laminating or, for example compressing, may also include the step of applying a vacuum to one or more of the superstrate, the optoelectronic element, and the curable silicone composition, or any other component described above. Alternatively, the step of applying a vacuum may be performed independent of the step of laminating or compressing or may not be utilized at all. Still further, the step of laminating may include the step of applying heat to one or more of the superstrate, the optoelectronic element, and the curable silicone composition, or any other component described above. Alternatively, the step of applying heat may be independent from the step of laminating or compressing or not be utilized at all.

Typically, if a vacuum is applied, the vacuum is operated at a pressure of from 15 to 30, 20 to 30, 25 to 30, 28 to 30, 16 to 29, 17 to 28, 18 to 27, 19 to 26, 20 to 25, 21 to 24, or 22 to 23, inches of mercury. Similarly, if heat is applied, the superstrate, the optoelectronic element, and/or the curable silicone composition, or any other component described above, may be heated at a temperature of from 50 to 160, 70 to 120, 70 to 100, 55 to 155, 60 to 150, 65 to 145, 70 to 140, 75 to 135, 80 to 130, 85 to 125, 90 to 120, 95 to 115, 100 to 110, or 105 to 110, ° C. The step of laminating may be further defined as simultaneously applying a vacuum and a compression force and subsequently applying heat to any one or more components described above. For example, the method may include the step of simultaneously applying a vacuum and a compression force to evacuate the air from the interior of the electronic article to the perimeter of the electronic article through the at least one passage to form a compressed layer of the curable silicone layer and subsequently applying heat to heat the curable silicone composition.

In one embodiment, the electronic article further includes the silicone tie layer disposed on the superstrate and sandwiched between the optoelectronic element and the superstrate. In this embodiment, the step of laminating is further defined as laminating the superstrate, the optoelectronic element, the curable silicone composition, and the second silicone composition to form the silicone encapsulant, the silicone tie layer, and the electronic article.

In another embodiment, the electronic article further includes the backsheet disposed on the silicone encapsulant and sandwiching the silicone encapsulant between the optoelectronic element and the backsheet. In this embodiment, the step of laminating is further defined as laminating the superstrate, the optoelectronic element, the curable silicone composition, and the backsheet to cure the curable silicone composition and form the silicone encapsulant and to form the electronic article.

In a further embodiment, the electronic article further includes the plurality of fibers. In this embodiment, the step of laminating may be further defined as laminating the superstrate, the optoelectronic element, the curable silicone composition, the optional backsheet, the plurality of fibers, and optionally the second silicone composition, to form the silicone encapsulant, to optionally form the silicone tie layer, and to form the electronic article.

During the step of laminating the curable silicone composition cures to form the silicone encapsulant and air escapes from the interior of the electronic article to the perimeter of the electronic article through the at least one passage. For example, the air may escape or may be evacuated using compression and/or vacuum. The escape of the air through the at least one passage allows the electronic article to be formed with minimal to no visible defects. In one embodiment, the electronic article, silicone encapsulant and/or the silicone tie layer is substantially free of entrapped air (bubbles). The terminology "air bubble" describes an enclosed volumetric space within the layer of silicone encapsulant wherein the enclosed volumetric space contains at least some quantity of gaseous or vaporous substance from earth's atmosphere. The air pressure in the air bubble may be 101 kilopascals (kPa), alternatively less than 101 kPa such as <50 kPa, alternatively <20 kPa, alternatively <10 kPa, alternatively <5 kPa. The terminology "substantially free" describes that the electronic article has no visible air bubbles when viewed with the naked eye or under 10× magnification. In other embodiments, the electronic article, the silicone encapsulant, and/or the silicone tie layer may be formed with less than 20, 15, 10, 5, 4, 3, 2, or 1 air bubble per square meter of the silicone encapsulant and/or silicone tie layer, wherein the air bubbles have a diameter of less than 0.1, 0.2, 0.3, 0.4, 0.5, 0.6, 0.7, 0.8, 0.9, or 1, mm. Alternatively, one or more of the article or any layer or component therein may be described as free from (visual) defects, cracks, voids, bubbles, and/or delamination under 10× (10 times) magnification and/or to the unaided eye. For example, the lack of voids or bubbles in the silicone encapsulant may be visually evaluated by direct evaluation looking through the superstrate and/or through the backsheet, and/or through direct evaluation of the silicone encapsulant itself (e.g. if no backsheet and/or fibers are utilized).

In a further embodiment, the superstrate and the backsheet are both silica glass or at least one or both is rigid. In a related embodiment, the electronic article may include at least one spacer disposed along the perimeter and disposed on and in direct contact with both the superstrate and the backsheet to provide the electronic article with a uniform thickness across the electronic article of ±1, 2, 3, 4, 5, 6, 7, 8, 9, 10, 11, 12, 13, 14, 15, 16, 17, 18, 19, or 20, % of a nominal thickness of the spacer. The at least one space may also prevent or minimize the rigid layer(s) from contacting one another and deflecting. In one embodiment, a 0.8 mm thick silicone elastomer spacer is utilized that is about ½ inch wide. This spacer is continuously applied around the (entire) perimeter of the module and has a Shore A Hardness of at least 10. The spacer can optionally be primed with a vinyl-rich silane to enhance cohesive failure between the glass substrate and encapsulant surface.

The at least one spacer is not limited in size or composition. In carious embodiments, the at least one spacer is rubber or silica glass or a polymer or a combination thereof. The size of the at least one spacer is also not limited and may have a length, height, and/or width of 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, or 1, 2, 3, 4, 5, 6, 7, 8, 9, 10, 11, 12, 13, 14, 15, 16, 17, 18, 19, 20, 25, 30, 35, 40, 45, 50, 55, 60, 65, 70, 75, 80, 85, 90, 95, or 100, or more, mm Any of the aforementioned values may, for example, vary by 1, 2, 3, 4, 5, 10, 15, 20, or 25+% in varying non-limiting embodiments. All values, and ranges of values, between and including the aforementioned values are also hereby expressly contemplated in various non-limiting embodiments. One or more spacers may be removed during the method or may be incorporated into the completed article. In addition, a sealant may be added to the article to either supplement or replace space occupied by one or more fillers. The sealant is not particularly limited and may be any known in the art.

EXAMPLES

Example A

A curable silicone composition is formed including a dimethylvinyl terminated polydimethyl-siloxane, a suitable amount of poly(dimethylmethylhydrogen)siloxane crosslinker containing >3 SiH units per molecule, a hydrosilylation catalyst (Pt), and an inhibitor (tetramethylvinyl cyclosiloxane). The viscosity of the mixture has an initial mixed complex viscosity from 40,000 cP to 80,000 cP at 25° C. determined using a TA Instruments, Discovery HR-2, parallel plate rheometer at a frequency of 1 radian/sec and at a strain rate within the viscoelastic range, 1%-5%.

Example B

A curable silicone composition is formed including 98 wt % Example A and 2% by weight fumed silica (Aerosil 200) and has a complex viscosity from 80,000 to 180,000 cP at 25° C. determined using a TA Instruments, Discovery HR-2, parallel plate rheometer at a frequency of 1 radian/sec and at a strain rate within the viscoelastic range, 1%-5%. The fumed silica is dispersed into Example B using a centrifugal mixer supplied by Hauschild Corporation.

Example C

A silicone composition is formed including 70 wt % of Example A and 30 wt % of a 300,000 cP polydimethylsiloxane fluid and has a viscosity from 100,000 to 150,000 cP at 25° C. measured as described above.

Example D

A curable silicone composition including a dimethylvinyl terminated polydimethyl-siloxane, a suitable amount of poly(dimethylmethylhydrogen)siloxane crosslinker containing >3 SiH units per molecule, a hydrosilylation catalyst (Pt), and an inhibitor (tetramethylvinylcyclosiloxane) and has an initial mixed complex viscosity from 500 cP to 2000 cP at 25° C. determined using a TA Instruments, Discovery HR-2, parallel plate rheometer at a frequency of 1 radian/sec and at a strain rate within the viscoelastic range, 1%-5%.

Example E

A silicone composition is formed including 97 wt % of Example D and 3 wt % of Aerosil 200 and has a complex viscosity of 106,932 cP at 25° C. measured determined using a TA Instruments, Discovery HR-2, parallel plate rheometer at a frequency of 1 radian/sec and at a strain rate within the viscoelastic range, 1%-5%. The fumed silica is dispersed into Example E using a centrifugal mixer supplied by Hauschild Corporation.

Example F

A silicone composition is formed including 95 wt % of Example D and 5 wt % of Aerosil 200 and has a complex viscosity of 1.80E6 cP at 25° C. determined using a TA Instruments, Discovery HR-2, parallel plate rheometer at a frequency of 1 radian/sec and at a strain rate within the viscoelastic range, 1%-5%. The fumed silica is dispersed into Example F using a centrifugal mixer supplied by Hauschild Corporation.

|  | Material | wt % Part A | wt % Part B | Mixed |
|---|---|---|---|---|
| Example A |  |  |  |  |
|  | Vinyl Polymer 1 | 98.82 | 97.84 |  |
| 8 ppm Pt total formulation | Catalyst | 0.18 |  |  |
| 0.5% AP total formulation | OFS-6030 | 1.00 |  |  |
| 2.2 SiH:Vi | SiH Crosslinker |  | 2.1 |  |
| 300 ppm Inhibitor total form | Inhibitor |  | 0.06 |  |
|  |  | 100 | 100 |  |
| Viscosity | (Cone (CP52) & Plate Viscometer HADVII+@ 1 rpm) | 53,976 cP | 52,190 cP | 61,000 cP |
| Complex Viscosity | (Frequency sweep curve @ 5% strain | 49,607 cP |  |  |

-continued

|  | Material | wt % Part A | wt % Part B | Mixed |
|---|---|---|---|---|
|  | and reading @ 1 rad/sec) |  |  |  |
| Example B |  |  |  |  |
|  | Vinyl Polymer 1 | 96.86 | 95.88 |  |
|  | Aerosil 200 | 1.96 | 1.96 |  |
| 8 ppm Pt total formulation | Catalyst | 0.18 |  |  |
| 0.5% AP total formulation | OFS-6030 | 1.00 |  |  |
| 2.2 SiH:Vi | SiH Crosslinker |  | 2.1 |  |
| 300 ppm Inhibitor total form | Inhibitor |  | 0.06 |  |
|  |  | 100 | 100 |  |
| Viscosity | (Cone (CP52) & Plate Viscometer HADVII+ @ 1 rpm) | 97,434 cP | 100,014 cP | 107k cP |
| Complex Viscosity | (Frequency sweep curve @ 5% strain and reading @ 1 rad/sec) | 121,931 cP |  |  |
| Example D |  |  |  |  |
|  | Vinyl Polymer 2 | 77.13 | 60.76 |  |
|  | Vinyl Polymer 3 | 4.19 | 9.80 |  |
|  | Vinyl Polymer 4 | 16.41 | 16.43 |  |
| 12 ppm Pt total formulation | Catalyst | 0.27 |  |  |
| 1.0% AP total formulation | OFS-6030 | 2.00 |  |  |
| 1.5 SiH/Vi ratio | SiH Crosslinker |  | 13.00 |  |
| 50 ppm Inhibitor total form | Inhibitor |  | 0.01 |  |
|  |  | 100 | 100 |  |
| Viscosity | (Cone (CP52) & Plate Viscometer HADVII+ @ 1 rpm) | 1,878 cP | 1,258 cP | 1,500 cP |
| Complex Viscosity | (Frequency sweep curve @ 5% strain and reading @ 1 rad/sec) | 1,724 cP |  |  |
| Example E |  |  |  |  |
|  | Vinyl Polymer 2 | 74.89 | 60.00 |  |
|  | Vinyl Polymer 3 | 4.07 | 9.51 |  |
|  | Vinyl Polymer 4 | 15.93 | 15.95 |  |
|  | Aerosil 200 | 2.91 | 2.91 |  |
| 12 ppm Pt total formulation | Catalyst | 0.26 |  |  |
| 1.0% AP total formulation | OFS-6030 | 1.94 |  |  |
| 1.5 SiH/Vi ratio | SiH crosslinker |  | 12.62 |  |
| 50 ppm Inhibitor total form | Inhibitor |  | 0.01 |  |
|  |  | 100 | 100 |  |
| Viscosity | (Cone (CP52) & Plate Viscometer HADVII+ @ 1 rpm) | 63,104 cP | 55,365 cP | 64,096 cP |
| Complex Viscosity | (Frequency sweep curve @ 5% strain and reading @ 1 rad/sec) | 106,932 cP |  |  |
| Example F |  |  |  |  |
|  | Vinyl Polymer 2 | 73.46 | 57.87 |  |
|  | Vinyl Polymer 3 | 3.99 | 9.33 |  |
|  | Vinyl Polymer 4 | 15.63 | 15.65 |  |
|  | Aerosil 200 | 4.76 | 4.76 |  |
| 12 ppm Pt total formulation | Catalyst | 0.26 |  |  |
| 1.0% AP total formulation | OFS-6030 | 1.90 |  |  |
| 1.5 SiH/Vi ratio | SiH crosslinker |  | 12.38 |  |
| 50 ppm Inhibitor total form | Inhibitor |  | 0.01 |  |
|  |  | 100 | 100 |  |
| Viscosity | (Cone (CP52) & Plate Viscometer HADVII+ @ 1 rpm) | ~200,000* cP | ~193,000* cP | ~200,000* cP |
| Complex Viscosity | (Frequency sweep curve @ 5% strain and reading @ 1 rad/sec) | 1.801E6 cP |  |  |

*Shear thinning caused difficulty in viscosity reading, to be repeated at lower speed Evaluation:

Samples of the aforementioned Examples are independently applied to both silica glass panels (superstrate) and to clear Mylar® backsheets, respectively. The samples are applied with a manual draw-down technique using a notched blade (a trowel) where the notching is 0.038" on the blade used against the silica glass, and 0.042" notches for the blade used against the clear Mylar®. This draw-down technique yields beads (rows) of the samples that are spaced 0.5" apart on center.

Subsequently, a pair of photovoltaic cells (a string) is disposed on each of the silicone beads disposed on the silica glass superstrate. Then, the Mylar sheet with the silicone beads is applied to the string of photovoltaic cells lining up the beads on the silica glass superstrate and on the Mylar sheet thereby forming channels that extend from an interior of the construct to a perimeter which will allow air to escape through the channels. This construct is then placed on a mirrored stage that allows observation of flow-out of the silicone rows over time and the escape of air through the channels. This is completed at room temperature with no vacuum or heat to determine how long the rows of encapsulant will maintain their shape from the weight of the cells on the front encapsulant and the weight of the clear Mylar backsheet.

Results:

Example A

Beads flow together in about 6 minutes.

Example B

After 16 minutes beads remain separate and there is no indication that the beads will flow together without application of additional weight or force.

Example C

Beads flow together in 6 minutes.

Example D

Beads flow together in <6 minutes.

Example E

After 16 minutes beads remain separate and there is no indication that the beads will flow together without application of additional weight or force.

The data shows that when we there is no flow out, there are no visible air bubbles present in full size modules. Said differently, the data shows that materials that do not flow out allow the rows of encapsulant to maintain shape such that when laminates are, for example, vacuum laminated, the air can escape, or be evacuated, through the passages, thereby resulting in bubble free laminated.

Additional data is incorporated within complex dynamic viscosities described above and generated from a cone and plate viscometer HADVII+ with spindle 52 at 1 rpm. For example, complex viscosity frequency sweeps may be used and the complex viscosity reported at 1 rad/sec when the viscosities are quite high because the HADVII+ viscometer has upper end viscosity limitations. For this reason, rheometer frequency sweep curves may be generated on the higher end viscosities.

One or more of the values described above may vary by ±5%, ±10%, ±15%, ±20%, ±25%, etc. so long as the variance remains within the scope of the disclosure. Unexpected results may be obtained from each member of a Markush group independent from all other members. Each member may be relied upon individually and or in combination and provides adequate support for specific embodiments within the scope of the appended claims. The subject matter of all combinations of independent and dependent claims, both singly and multiply dependent, in addition to all combinations of paragraphs and embodiments described therein, is herein expressly contemplated. The disclosure is illustrative including words of description rather than of limitation. Many modifications and variations of the present disclosure are possible in light of the above teachings, and the disclosure may be practiced otherwise than as specifically described herein.

What is claimed is:

1. A method of forming an electronic article having a perimeter and comprising a superstrate, an optoelectronic element disposed on the superstrate, and a silicone encapsulant that is formed from a curable silicone composition and that is disposed as a layer on the optoelectronic element sandwiching the optoelectronic element between the superstrate and the layer of the silicone encapsulant, said method comprising the steps of:
   depositing the curable silicone composition on the optoelectronic element in a pattern defining at least one passage extending from an interior of the electronic article to a perimeter of the electronic article; and
   laminating the superstrate, the optoelectronic element, and the curable silicone composition to form the electronic article,
   wherein the curable silicone composition has an complex viscosity of from 10,000 to 50,000,000 cPs at 25° C. as measured at 1 radian per second at 1 to 5% strain, and
   wherein during the step of laminating the curable silicone composition cures to form the silicone encapsulant and air escapes from the interior of the electronic article to the perimeter of the electronic article through the at least one passage to form a layer of the curable silicone composition and the curable silicone composition cures to form the layer of the silicone encapsulant.

2. A method as set forth in claim 1 wherein 0 to 4 air bubbles are present per square meter of the silicone encapsulant wherein the air bubbles have a diameter of less than 1 mm.

3. A method as set forth in claim 1 wherein the electronic article further comprises a silicone tie layer disposed on the superstrate and sandwiched between the optoelectronic element and the superstrate, wherein the silicone tie layer is formed from a second curable silicone composition, and wherein the step of laminating is further defined as laminating the superstrate, the optoelectronic element, the curable silicone composition, and the second curable silicone composition to form the silicone tie layer and to form the electronic article further comprising the silicone tie layer.

4. A method as set forth in claim 1 wherein the electronic article further comprises a backsheet disposed on the silicone encapsulant and sandwiching the silicone encapsulant between the optoelectronic element and the backsheet.

5. A method as set forth in claim 1 wherein the method further comprises the step of applying a vacuum to evacuate the air from the interior of the electronic article to the perimeter of the electronic article through the at least one passage to form the layer of the curable silicone composition.

6. A method as set forth in claim 1 wherein the method further comprises the step of applying heat to heat the curable silicone composition during the step of laminating.

7. A method as set forth in claim 1 wherein the step of laminating is further defined as simultaneously applying a vacuum and a compression force to evacuate the air from the interior of the electronic article to the perimeter of the electronic article through the at least one passage to form a compressed layer of the curable silicone layer and subsequently applying heat to heat the curable silicone composition.

8. A method as set forth in claim 1 wherein the pattern is further defined as comprising two or more rows of the curable silicone composition each disposed on the optoelectronic element approximately parallel to one another.

9. A method as set forth in claim 1 wherein the pattern is further defined as comprising two or more rows of the curable silicone composition each disposed on the optoelectronic element transverse to one another.

10. A method of forming a photovoltaic cell module having a perimeter and comprising a superstrate having a light transmittance of at least 70 percent as determined by UV/Vis spectrophotometry using ASTM E424-71 (2007) (ASTM International, formerly American Society for Testing and Materials), a photovoltaic cell disposed on the superstrate, and a silicone encapsulant disposed as a layer on the photovoltaic cell and sandwiching the photovoltaic cell between the superstrate and the layer of the silicone encapsulant, said method comprising the steps of:

depositing the curable silicone composition on the photovoltaic cell in a pattern defining at least one passage extending from an interior of the photovoltaic cell module to a perimeter of the photovoltaic cell module; and laminating the superstrate, the photovoltaic cell, and the curable silicone composition to form the photovoltaic cell module, wherein the curable silicone composition has an complex viscosity of from 80,000 to 200,000 cPs at 25° C. as measured at 1 radian per second at 1 to 5% strain, and wherein during the step of laminating the curable silicone composition cures to form the silicone encapsulant and air escapes from the interior of the photovoltaic cell module to the perimeter of the photovoltaic cell module through the at least one passage to form a layer of the curable silicone composition and the curable silicone composition cures to form the layer of the silicone encapsulant.

11. A method as set forth in claim 10 wherein less than 5 air bubbles are present per square meter of the silicone encapsulant wherein the air bubbles have a diameter of less than 1 mm.

12. A method as set forth in claim 10 wherein the photovoltaic cell module further comprises a silicone tie layer disposed on the superstrate and sandwiched between the optoelectronic element and the superstrate, wherein the silicone tie layer is formed from a second curable silicone composition, and wherein the step of laminating is further defined as laminating the superstrate, the optoelectronic element, the curable silicone composition, and the second curable silicone composition to form the silicone tie layer and to form the photovoltaic cell module further comprising the silicone tie layer.

13. A method as set forth in claim 10 wherein the photovoltaic cell module further comprises a backsheet disposed on the silicone encapsulant and sandwiching the silicone encapsulant between the optoelectronic element and the backsheet.

14. A method as set forth in claim 10 wherein the method further comprises the step of applying a vacuum to evacuate the air from the interior of the photovoltaic cell module to the perimeter of the photovoltaic cell module through the at least one passage to form the layer of the curable silicone composition.

15. A method as set forth in claim 10 wherein the method further comprises the step of applying heat to heat the curable silicone composition during the step of laminating.

16. A method as set forth in claim 10 wherein the pattern is further defined as comprising two or more rows of the curable silicone composition each disposed on the optoelectronic element approximately parallel to one another.

17. A method as set forth in claim 10 wherein the pattern is further defined as comprising two or more rows of the curable silicone composition each disposed on the optoelectronic element transverse to one another.

* * * * *